(12) United States Patent
Straeussnigg et al.

(10) Patent No.: US 7,834,789 B2
(45) Date of Patent: *Nov. 16, 2010

(54) SAMPLING ERROR REDUCTION IN PWM-MASH CONVERTERS

(75) Inventors: Dietmar Straeussnigg, Villach (AT); Luis Hernandez, Madrid (ES); Daniel Mark, Keutschach (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/418,632

(22) Filed: Apr. 6, 2009

(65) Prior Publication Data
US 2009/0207058 A1 Aug. 20, 2009

Related U.S. Application Data

(63) Continuation of application No. 11/923,494, filed on Oct. 24, 2007, now Pat. No. 7,535,393.

(51) Int. Cl.
*H03M 3/00* (2006.01)
(52) U.S. Cl. .................. 341/143; 341/118; 341/155
(58) Field of Classification Search ............ 341/118, 341/143
See application file for complete search history.

(56) References Cited

U.S. PATENT DOCUMENTS

| | | | |
|---|---|---|---|
| 5,471,209 A * | 11/1995 | Sutterlin et al. | 341/143 |
| 5,838,272 A * | 11/1998 | Steiner et al. | 341/143 |
| 5,959,562 A | 9/1999 | Wiesbauer | |
| 6,008,703 A | 12/1999 | Perrott et al. | |
| 6,016,112 A * | 1/2000 | Knudsen | 341/118 |
| 6,369,730 B1 * | 4/2002 | Blanken et al. | 341/143 |
| 6,414,613 B1 | 7/2002 | Midya et al. | |
| 6,741,197 B1 | 5/2004 | Melanson | |
| 6,839,387 B1 | 1/2005 | Mittel | |
| 7,006,762 B2 | 2/2006 | Baskin | |
| 7,123,101 B2 | 10/2006 | Puma et al. | |
| 7,535,393 B1 * | 5/2009 | Straussnigg et al. | 341/143 |

FOREIGN PATENT DOCUMENTS

| | | |
|---|---|---|
| DE | 4333908 A1 | 4/1995 |
| DE | 10233391 C1 | 12/2003 |
| EP | 1229641 A1 | 8/2002 |

OTHER PUBLICATIONS

Bresch et al, "TMS320C67-Based Design of a Digital Audio Power Amplifier Introducing Novel Feedback Strategy," Rose-Hulman Institute of Technology, Electrical and Computer Engineering Department, no date (available at least as early as Sep. 12, 2007), pp. 1-16.

(Continued)

*Primary Examiner*—Khai M Nguyen
(74) *Attorney, Agent, or Firm*—SpryIP, LLC

(57) ABSTRACT

Techniques for reducing sampling error in electronic components are described herein.

19 Claims, 4 Drawing Sheets

OTHER PUBLICATIONS

Lampton et al, "A high-speed wide dynamic range time-to-digital converter," Review of Scientific Instruments, vol. 65, No. 11, Nov. 1994, pp. 3577-3584.

Markus et al, "An Efficient Delta-Sigma Noise-Shaping Architecture for Wideband Applications," 4th International Conference on Advanced A/D and D/A Conversion Techniques and Their Applications & 7th European Workshop on ADC Modelling and Testing (ADDA-EWADC'2002), Prague, Jun. 26-28, 2002, pp. 35-38.

Erickson, "A Fundamental Introduction to the Compact Disc Player", Department of Electrical Engineering University of Minnesota, Nov. 29, 1994, EE 3011, Professor: Dr. Kevin M. Buckley, pp. 1-19, http://www.tc.umn.edu/~erick205/Papers/3011Paper.pdf.

Holme, "15-25 MHz Fractional-N Synthesizer", Mash (Multi-stAge noise SHaping) structure, copyright by Andrew Holme, 2005, pp. 1-4 http://www.holmea.demon.co.uk/Frac2/Mash.htm.

Holme, "Fractional-N Frequency Synthesizer", Mash Sequence, copyright by Andrew Holme, 2004, pp. 1-4 http://www.holmea.demon.co.uk/FracN/Simulate.htm.

* cited by examiner

SAMPLING ERROR REDUCTION IN PWM-MASH CONVERTERS

CROSS-REFERENCE TO RELATED APPLICATIONS/PRIORITY CLAIM

This patent application is related to co-pending, commonly-owned U.S. patent application Ser. No. 11/923,550 entitled "Quantization Error Reduction in PWM Full-MASH Converters" filed on Oct. 24, 2007, which application is incorporated herein by reference.

This patent application is a continuation application of pending U.S. patent application Ser. No. 11/923,494, which was filed on Oct. 24, 2007. The priority of the U.S. patent application Ser. No. 11/923,494 is hereby claimed and the contents of the Application are hereby incorporated herein by reference.

BACKGROUND

Converters for converting analog signals to digital signals and vice versa are found in a wide variety of circuits and devices, including compact disc (CD) players, digital video disc (DVD) players, signal processors, and various other systems that communicate signals. In general, the accuracy and quality of the signal conversion process increases with increasing sampling rate provided, that noise introduced by the digitization process (i.e., sampling and quantization) is properly taken into consideration.

Multi-stage noise shaping (MASH) converters are frequently used to separate and remove noise inherently introduced by digitization. Typically, as the number of noise-shaping stages of a MASH converter increases, the quality of the desired signal also increases. MASH converters are particularly useful for applications in which oversampling is used, such as in certain pulse-width-modulation (PWM) converters. The term oversampling refers to the use of sampling frequencies that exceed a frequency dictated by the Nyquist theorem in order to boost signal-to-noise ratio and reduce quantization noise.

Unfortunately, as the number of noise-shaping stages (i.e. the order of the MASH converter) increases, power consumption and surface area requirements also increase.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

Disclosed herein are improved techniques for reducing sampling noise introduced by digitization processes in electronic components, including pulse width modulation (PWM) multi-stage noise shaping (MASH) converters. In general, techniques in accordance with the present disclosure may advantageously reduce or eliminate sampling noise, allowing electronic components to operate effectively at reduced sampling rates, with corresponding reductions in power consumption, surface area requirements, and fabrication costs in comparison with conventional noise shaping techniques.

In general, implementations in accordance with the present disclosure measure an error introduced by a sampling portion of the digitization process, and remove the sampling error from the digital output signal. In some implementations, the sampling error may be measured using a time-to-digital converter (TDC). Substantial advantages in operational performance and fabrication costs of electronic components may be achieved by removal of the sampling error in accordance with the teachings of the present disclosure.

Techniques for reducing sampling noise in accordance with the present disclosure may be implemented in a number of ways. One example environment and context is provided below with reference to the included figures and the on going discussion.

Exemplary Systems

Figure 1:
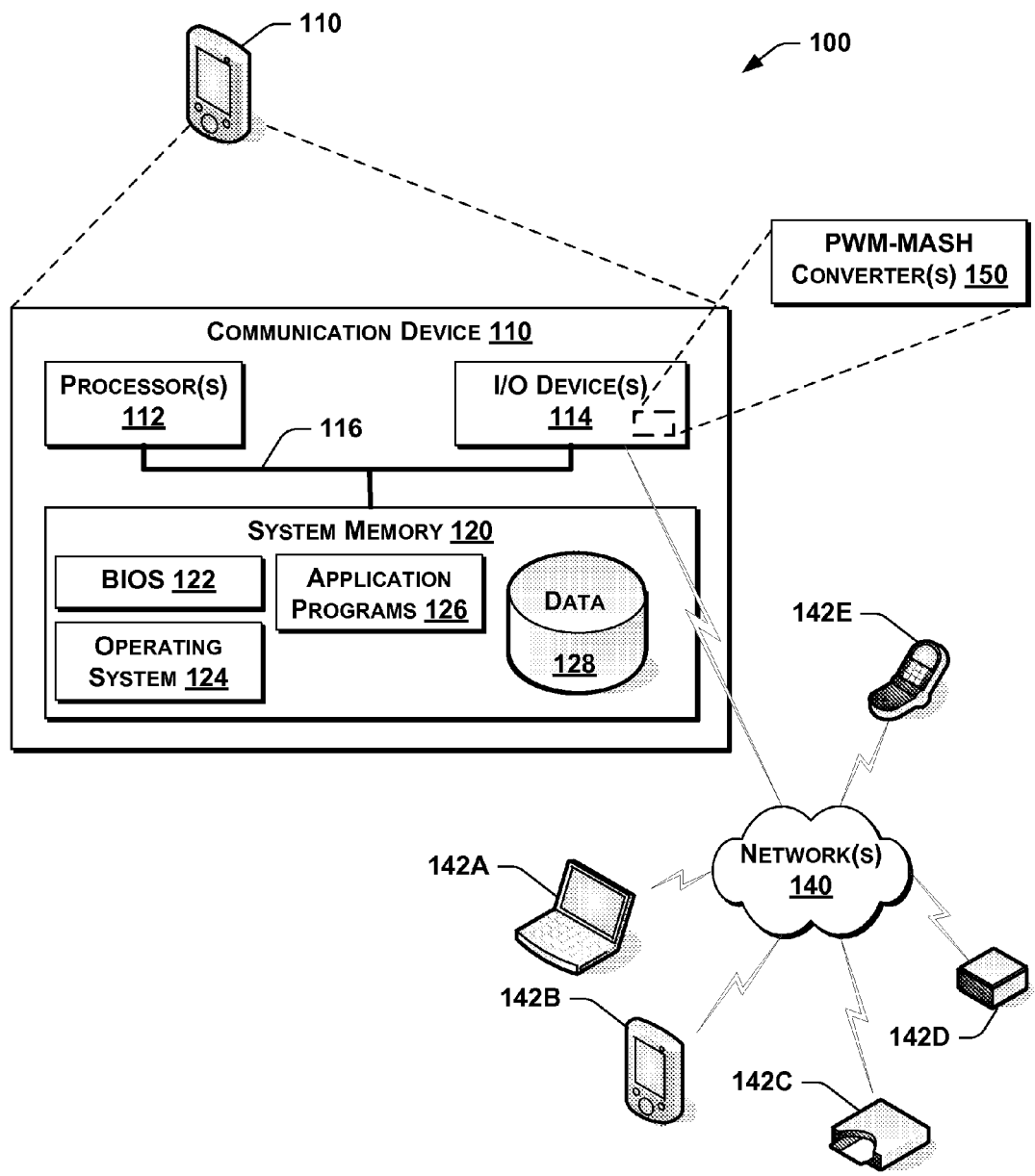
FIG. 1 is an exemplary environment in which techniques in accordance with the present disclosure may be implemented.

FIG. 1 illustrates an exemplary environment 100 in which techniques in accordance with the present disclosure may be implemented. In this implementation, the environment 100 includes a communication device 110 having one or more pulse-width modulation (PWM) multi-stage noise shaping (MASH) converters 150 configured in accordance with the teachings of the present disclosure. The communication device 110 operatively communicates via one or more networks 140 with a plurality of other devices 142. Alternately, the communication device 110 may bypass the networks 140 and communicate directly with one or more of the other devices 142. Detailed descriptions of various aspects of the PWM-MASH converter 150 are provided in the following sections with reference to FIGS. 2 through 6.

In the representative environment 100, the communication device 110 is a hand-held device, such as an MP3 (Moving Picture Exerts Group Layer-3) player, a personal data assistant (PDA), a global positioning system (GPS) unit, or other similar hand-held device, and the other devices 142 may include, for example, a computer 142A, another hand-held device 142B, a compact disc (CD) or digital video disc (DVD) player 142C, a signal processor 142D (e.g., radio, navigational unit, television, etc.), and a cell phone 142E. In alternate implementations, of course, the devices 110, 142 may include any other suitable devices, and it is understood that any of the plurality of devices 142 may be equipped with PWM-MASH converters 150 that operate in accordance with the teachings of the present disclosure.

As further shown in FIG. 1, the communication device 110 includes one or more processors 112 and one or more input/output (I/O) devices 114 (e.g., transceivers, transmitters, receivers, etc.) coupled to a system memory 120 by a bus 116. In the implementation shown in FIG. 1, the PWM-MASH converter 150 is included as a component within the I/O devices 114 of the communication device 110. In alternate implementations, however, the PWM-MASH converter 150 may be integrated with any other suitable portion of the device 110, or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures. The I/O component 114 may be configured to operatively communicate with one or more external networks 140, such as a cellular telephone network, a satellite network, an information network (e.g., Internet, intranet, cellular network, cable network, fiber optic network, LAN, WAN, etc.), an infrared or radio wave communication network, or any other suitable network.

The system memory 120 may include computer-readable media configured to store data and/or program modules for implementing the techniques disclosed herein that are immediately accessible to and/or presently operated on by the processor 112. For example, the system memory 120 may also store a basic input/output system (BIOS) 122, an operating system 124, one or more application programs 126, and program data 128 that can be accessed by the processor 112 for performing various tasks desired by a user of the communication device 110.

Moreover, the computer-readable media included in the system memory 120 can be any available media that can be accessed by the device 110, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 110 (FIG. 1) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown as in FIG. 1 as a communication network, this implementation is meant to serve only as a non-limiting example of a suitable environment for use of the PWM-MASH converter 150 in accordance with present disclosure. Similarly, the device 110 is simply one non-limiting example of a suitable device that may include PWM-MASH converters 150 in accordance with the present disclosure.

Multi-Stage Noise Shaping (MASH) Converters

Figure 2:
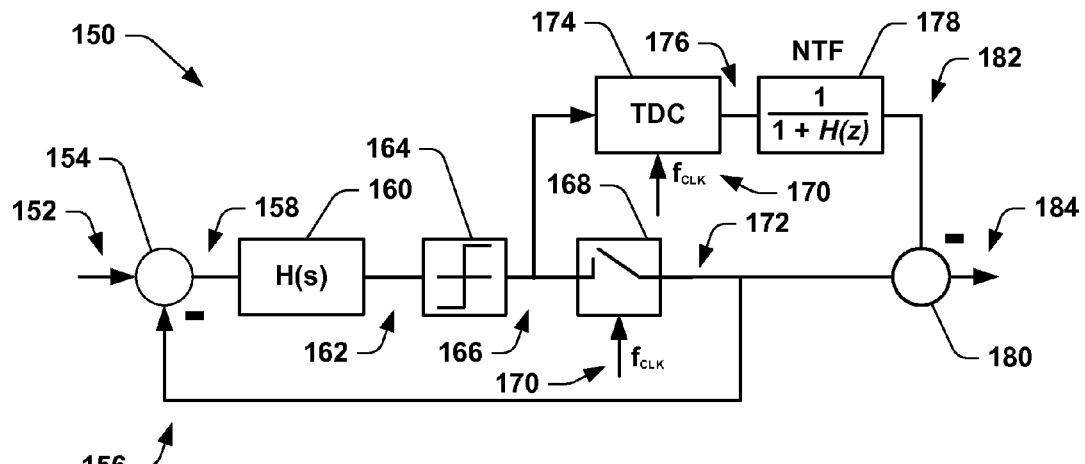
FIG. 2 is an exemplary pulse width modulation (PWM) multi-stage noise shaping (MASH) converter in accordance with an implementation of the disclosure.

Structural and operational aspects of implementations of pulse width modulation (PWM) multi-stage noise shaping (MASH) converters in accordance with the present disclosure will now be described. For example, a PWM-MASH converter 150 in accordance with an implementation of the present disclosure is shown in FIG. 2. In this implementation, the PWM-MASH converter 150 is an analog-to-digital converter.

More specifically, an input analog signal 152 arrives at a first combiner (or combining component) 154 which combines a feedback signal 156 with the input analog signal 152. In some embodiments, the first combiner 154 may be a summing (or differencing) component which adds (or subtracts) the feedback signal 156 from the input analog signal 152. In other embodiments, the first combiner 154 may combine these signals in other desired ways. A resulting signal 158 from the first combiner 154 is provided to a signal-shaping component 160 having a design described by a complex transfer function H(s) in the Laplace plane. The signal-shaping component 160 may be a pulse width modulator (PWM), a sigma-delta converter, a loop filter, or any other suitable signal-shaping component. In particular implementations, the signal-shaping component 160 may be a MASH component having any suitable number of stages (i.e., order M=1, 2, . . . N).

As further shown in FIG. 2, a shaped signal 162 from the signal-shaping component 160 is received by a comparator 164. The comparator 164 (or other suitable analyzer) provides a comparator output 166 based on the shaped signal 162. For example, in some implementations, as described more fully in co-pending, commonly-owned application DE 10233391 by Laaser Peter, incorporated herein by reference, the comparator output 166 may assume a value as follows: comparator output 166=A for shaped signal 162 greater than or equal to zero; and comparator output 166=b for shaped signal 162 less than zero. In a particular embodiment, A=1 and b=−1 when the analog input signal 152 is within a range from −1 to 1, inclusive (i.e., −1≦the analog input signal 152≦1).

The comparator output 166 is received by a sampling component 168. The sampling component 168 performs a time discretization on the comparator output 166 based on a sampling frequency (or $f_{CLK}$) 170 to provide a digitized output 172. The digitized output 172 may be fed back as the feedback signal 156 to the first combiner 154.

As further shown in FIG. 2, the comparator output 166 is also provided to a time-to-digital converter (TDC) 174. The TDC 174 also receives the sampling frequency (or $f_{CLK}$) 170, and measures a time displacement between a change-over period of the comparator 164 and the sampling of the comparator output 166. In other words, the TDC 174 provides a TDC digital output 176 that is a measure of the error originating via the sampling. An exemplary implementation of the TDC 174 is described below with reference to FIG. 3. A noise transfer function (NTF) component 178 receives the TDC digital output 176 and filters it using a NTF corresponding to the complex transfer function H(s) of the signal-shaping component 160, such that NTF=$(1+H(z))^{-1}$.

A second combiner 180 receives an error correction 182 from the NTF component 178, and the digitized output 172 from the sampling component 168, and combines the error correction 182 with the digitized output 172 to provide a corrected output 184. As noted above, the second combiner 180 may combine the signals by summing, differencing, or other suitable form of combination. Since the error correction 182 is the error originating via the sampling, the corrected output 184 (i.e. PWM signal) may be virtually free from sampling error.

Figure 3:
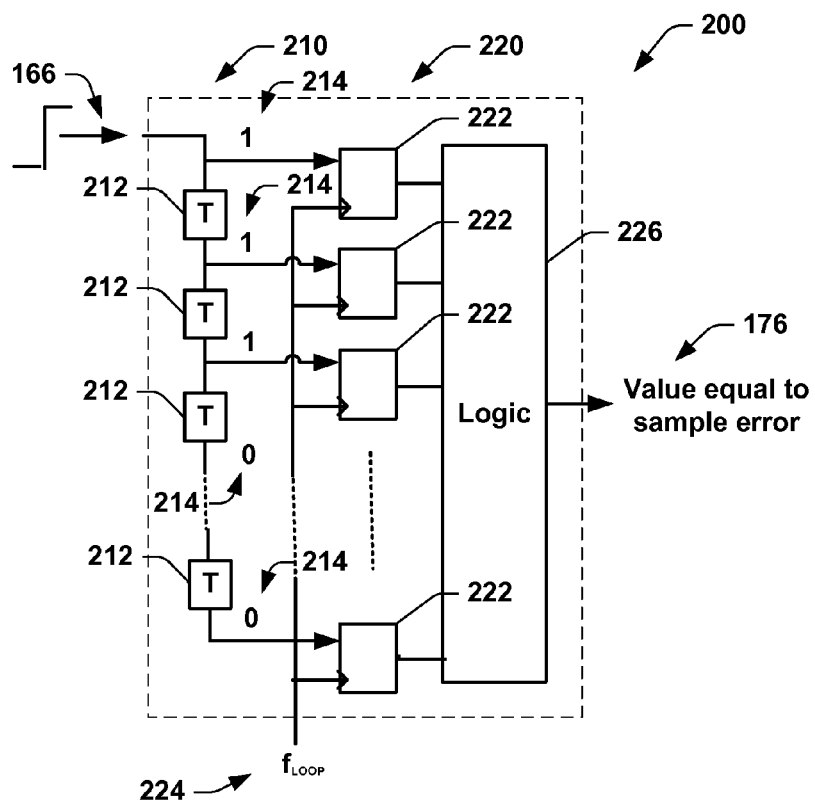
FIG. 3 is an exemplary time-to-digital converter (TDC) of the PWM-MASH converter of FIG. 2 in accordance with an implementation of the disclosure.

FIG. 3 is an exemplary time-to-digital converter (TDC) 200 of the PWM-MASH converter 150 of FIG. 2. In this implementation, the TDC 200 includes a delay line 210 having a series of delay elements 212, and a triggering line 220 that includes a series of readers 222. An output state 214 following each delay element 212 of the delay line 210 is provided to the triggering line 220. Each reader 222 has a first input that receives a clock signal (or $f_{LOOP}$) 224 at the sampling frequency (or $f_{CLK}$) 170 (FIG. 2), and a second input that receives the output state 214 from the delay line 210. A logic component 226 is coupled to receive output signals from the plurality of readers 222, and to provide the TDC output 176 that is the measured sampling error.

In operation, the comparator output 166 (or a portion of the comparator output 166, such as a "flank" portion) enters the delay line 210 and begins traversing through the series of delay elements 212. As the comparator output 166 passes each delay element 212 of the delay line 210, the output state 214 following each delay element 212 changes from a first (or nominal) value to a second value (e.g. from "0" to "1"). The delay elements 212 of the delay line 210 may be configured to provide suitably high resolution to cooperatively form a "thermometer" type of measurement of a time displacement of the comparator output 166 as compared to the clock signal (or sampling rate) 224. The output states 214 of the delay elements 212 are received by the readers 222, and as each clock signal 224 triggers the triggering line 220, the readers 222 communicate the output states 214 to the logic component 226. The logic component 226 then determines the TDC output 176 based on the outputs from the readers 222.

It will be appreciated that the TDC 200 described above and shown in FIG. 3 is one possible implementation, and that the present disclosure is not limited to any particular TDC implementation. A variety of other suitable TDCs may be used, including those TDCs generally described in *A High-Speed Wide Dynamic Range Time-to-Digital Converter* by Lampton and Raffanti, Rev. Sci. Instrum. 65 (11), November 1994, or other conventional TDC implementations.

Figure 4:
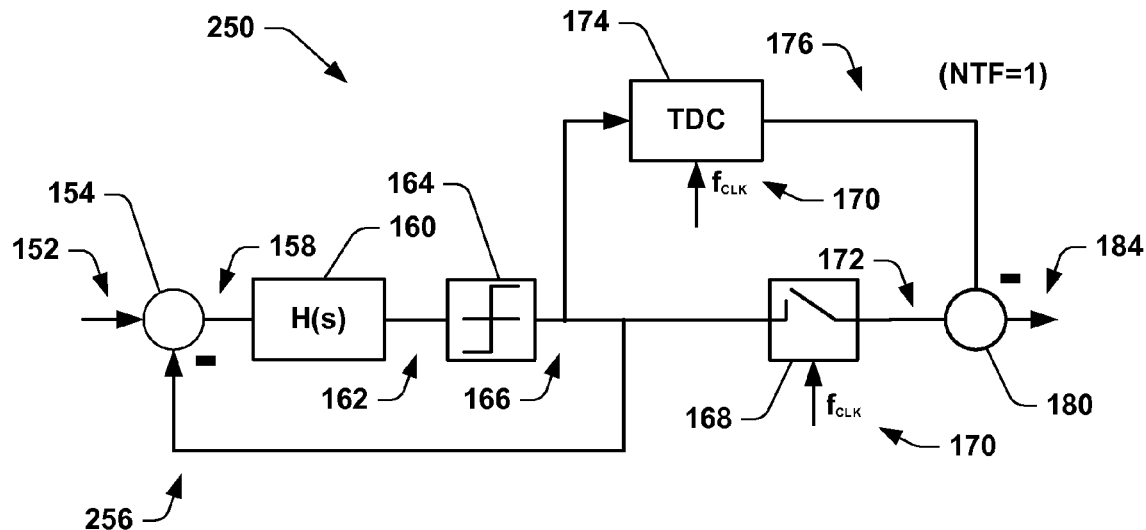
FIG. 4 is a PWM MASH converter in accordance with an alternative implementation of the disclosure.

Similarly, it will be appreciated that the PWM-MASH converter 150 described above is one particular implementation, and that a variety of alternate implementations of electronic components may be conceived in accordance with the teachings of the present disclosure. For example, FIG. 4 is a PWM MASH converter 250 in accordance with an alternative implementation of the disclosure. Many of the components of the PWM MASH converter 250 are similar to the previously-described implementation (FIG. 2), and for the sake of brevity, only significant differences between the converter 250 and the converter 150 will be described in detail.

In the implementation shown in FIG. 4, the converter 250 includes a first combiner 154 and a signal-shaping component 160 as described above, the signal-shaping component 160 having a design described by a complex transfer function H(s) in the Laplace plane. A shaped signal 162 from the signal-shaping component 160 is received by a comparator (or analyzer) 164 which, in turn, provides a comparator output 166.

In this implementation, the comparator output 166 is fed back as the feedback signal 256 to the first combiner 154. The comparator output 166 is also provided to a time-to-digital converter (TDC) 174 that receives the sampling frequency (or $f_{CLK}$) 170 and measures the error originating via the sampling. Thus, unlike the converter 150 (FIG. 2), the measurement of the sampling error in this implementation is performed outside the PWM loop on an asynchronous signal from the comparator 164.

As further shown in FIG. 4, a sampling component 168 performs a time discretization on the comparator output 166 based on a sampling frequency (or $f_{CLK}$) 170 to provide a digitized output 172. A second combiner 180 receives an error correction 176 from the TDC 174, and the digitized output 172 from the sampling component 168, and combines the error correction 176 with the digitized output 172 to provide a corrected output 184.

It will be appreciated that since the measurement of the sampling error in the converter 250 is performed outside the PWM loop, the requirement for a noise transfer function (NTF) component 178 is eliminated. Alternately, the converter 250 may be considered as having an NTF component 178 having an NTF=1.

Again, it will be appreciated that the converters 150, 250 are merely exemplary implementations in accordance with the present disclosure, and that a variety of alternate implementations may be conceived. For example, alternate implementations may be conceived for other types of converters, including non-PWM converters and non-MASH converters, based on the converter implementations 150, 250 (or combinations thereof). In further implementations, other electronic components that perform digitization may be conceived that incorporate techniques for reducing sampling errors in accordance with the teachings of the present disclosure including, for example, scanning components (e.g., for digitizing photographs, videotape, text, etc.), digital audio components, or any other suitable digitization devices.

Techniques in accordance with the teachings of the present disclosure may provide significant advantages. For example, because the sampling error is measured using the TDC (time-to-digital converter), the NTF (noise transfer function) may be assessed and removed from the output signal. By compensating for the sampling error, techniques in accordance with the present disclosure may use lower sampling rates without a loss of performance. In addition, techniques in accordance with the present disclosure enable analog to digital converters with very high cancellation which were not practical because of the very high clock speeds that were previously necessary.

Exemplary Process

An exemplary process for reducing sampling errors in accordance with the present disclosure will now be described. For simplicity, the process will be described with reference to the exemplary environment 100 and the exemplary PWM-MASH converter 150 described above with reference to FIGS. 1-4.

Figure 5:
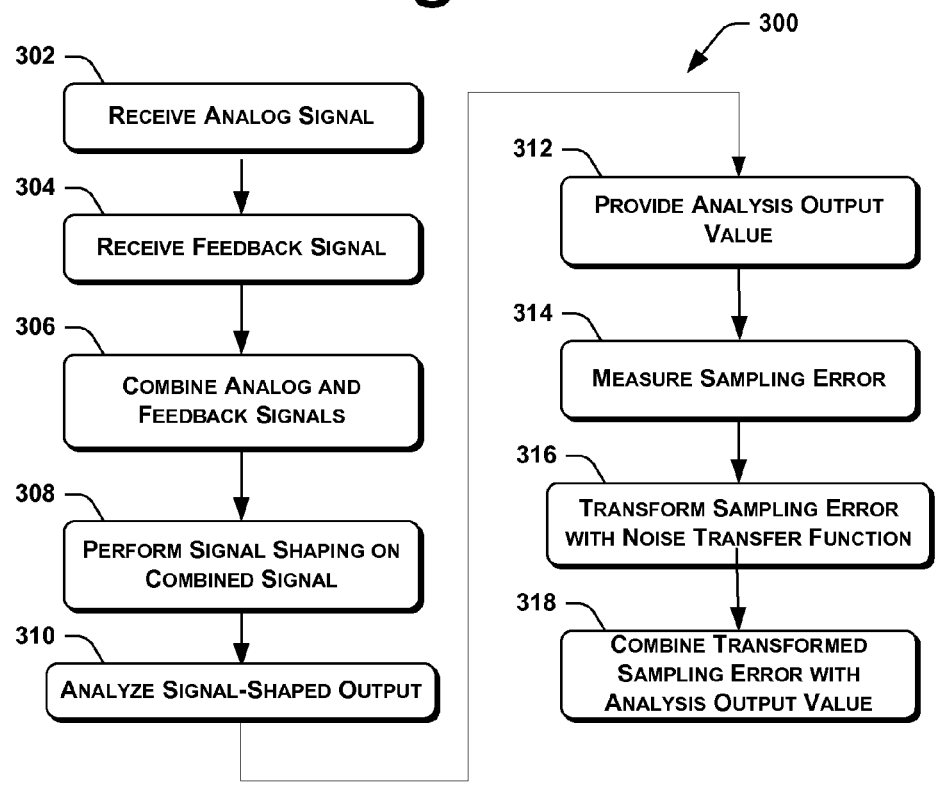
FIG. 5 is a flowchart of a process for reducing sampling noise in accordance with another implementation of the present disclosure.

FIG. 5 is a flowchart of a process 300 for reducing sampling noise in accordance with another implementation of the present disclosure. At 302, an analog signal is received, and a feedback signal is received at 304. A combined signal representing a combination (e.g., difference) of the analog and feedback signals is determined at 306, and signal shaping is performed on the combined signal at 308. In some implementations, the shaping may be performed using a PWM, a sigma-delta converter, a multi-stage noise shaping (MASH) component, a loop filter, or any other suitable signal-shaping component.

A shaped output resulting from the signal shaping (at 308) is analyzed at 310, and a digitized output is provided at 312. For example, in some implementations, the shaped output is analyzed using a comparator (or other suitable analyzer) that provides a comparator output 166 (FIG. 2). In particular embodiments, for example, the comparator output 166=A for a shaped output greater than or equal to zero, and the comparator output 166=b for a shaped output less than zero. The analysis may also include a sampling component 168 that samples the comparator output 168 at a desired sampling rate (e.g., at a clock frequency).

With continued reference to FIG. 5, at 314 the process 300 measures a sampling error introduced by a sampling of the analog signal. For example, in some implementations, the measurement of the sampling error (at 314) is performed using a time-to-digital converter (TDC). In a specific implementation, the TDC includes a time delay line that receives the analysis output value, and a triggering line that receives a clock signal at the sampling rate, and provides output from the time delay line to a logic component that determines the sampling error. In some implementations, the measurement of the sampling error may be performed on a synchronous signal, such as within a PWM loop of a converter. Alternately, the measurement of the sampling error may be performed outside of a PWM loop on an asynchronous signal.

At 316, the measured sampling error may be processed or transformed using a noise transfer function. In some implementations, such as when the sampling error is measured on a synchronous signal within a PWM loop, the noise transfer function (NTF) may represent an inverse of a complex transfer function H(s) of a loop filter used to perform the synchronization of the signal (e.g., NTF=$(1+H(z))^{-1}$). Alternately, when the sampling error is measured using an asynchronous signal outside a PWM loop, the NTF may be omitted or set to an identity function (e.g., NTF=1). The transformed sampling error is then combined with (e.g., subtracted from) the digitized output at 318, removing the sampling error from the output signal.

It should be appreciated that the process 300 is one possible implementation of the teachings disclosed herein, and that the present disclosure is not limited to the particular process implementation described above and shown in FIG. 5. For example, in alternate implementations, certain acts need not be performed in the order described, and may be modified, and/or may be omitted entirely, depending on the circumstances. Moreover, in various implementations, the acts described may be implemented by a computer, controller, processor, programmable device, or any other suitable device, and may be based on instructions stored on one or more computer-readable media or otherwise stored or programmed into such devices. In the event that computer-readable media are used, the computer-readable media can be any available media that can be accessed by a device to implement the instructions stored thereon.

Figure 6:
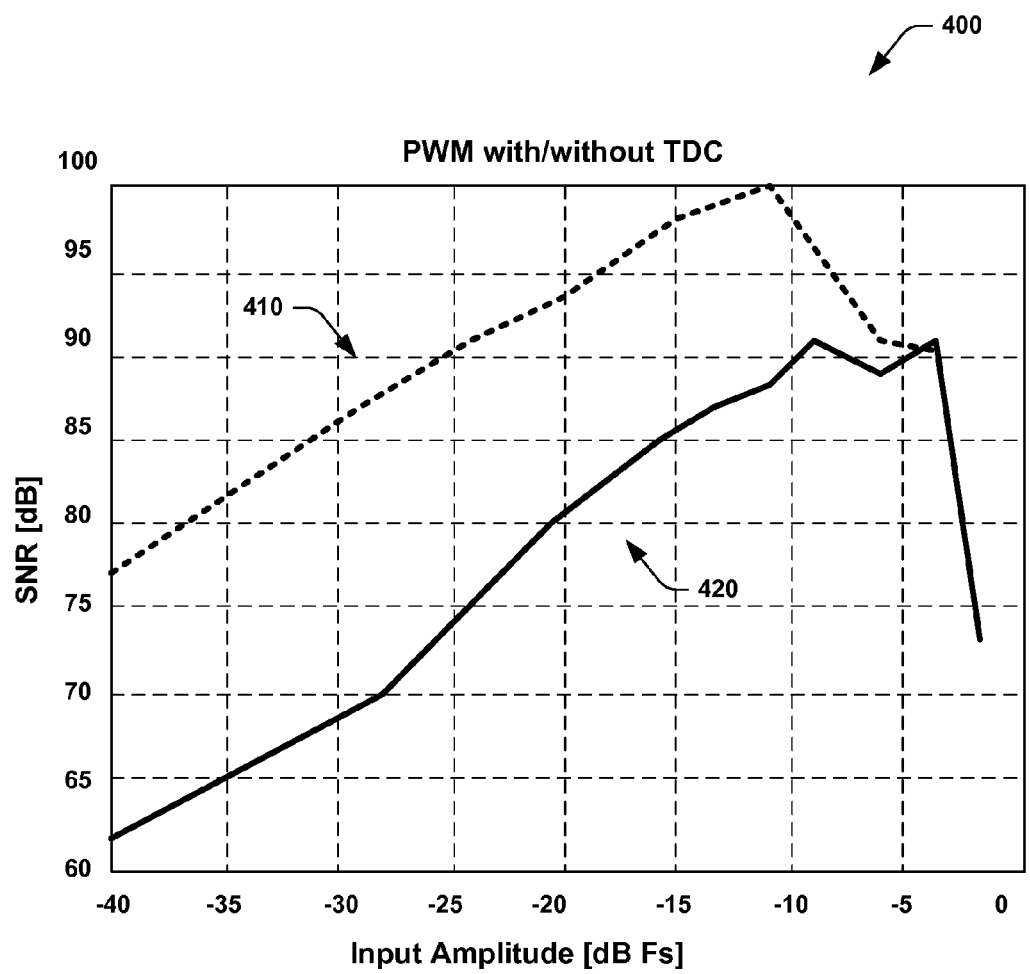
FIG. 6 shows simulation results demonstrating the effectiveness of techniques for reducing sampling noise in accordance with the present disclosure.

FIG. 6 presents a graph 400 of simulation results demonstrating the effectiveness of techniques for reducing sampling noise in accordance with the present disclosure. The simulation data shown in FIG. 6 were generated using the Simulink® computer simulation software commercially available from The Mathworks, Inc. of Natick, Mass. More specifically, signal to noise ratio (SNR) is plotted as a function of input amplitude for a PWM-MASH converter having a TDC as described above with reference to FIG. 2 (410), and for a conventional PWM-MASH converter (420). As shown in FIG. 6, the SNR is substantially improved due to the removal of the sampling error in the data 410 (at almost all input amplitudes) for the PWM-MASH converter having the TDC in accordance with the teachings of the present disclosure.

Accordingly, techniques in accordance with the present disclosure may advantageously reduce or eliminate sampling noise due to digitization in electronic components, including PWM-MASH converters. The elimination of sampling noise advantageously allows such electronic components to operate effectively at reduced sampling rates, with corresponding reductions in power consumption. In addition, surface area requirements and fabrication costs for MASH filters may be reduced in comparison with conventional electronic components.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. Accordingly, the scope of the invention should not be limited by the disclosure of the specific implementations set forth above. Instead, the invention should be determined entirely by reference to the claims that follow.

We claim:

1. A circuit, comprising:
an analyzer coupled to receive a shaped signal and to provide an analyzer output having associated therewith one of a first value and a second value, the analyzer output having associated therewith the first value when the shaped signal is within a first range, and the analyzer output having associated therewith the second value when the shaped signal is within a second range;
a sampling component to receive the analyzer output and a clock signal, and to provide a digitized output based on the clock signal; and
a sampling error determination portion coupled to the sampling component and having a time-to-digital converter configured to determine a sampling error based on a time difference between the analyzer output and the clock signal.

2. The circuit as recited in claim 1, further comprising a combiner component coupled to combine the sampling error with the digitized output to provide a final output.

3. The circuit as recited in claim 1, wherein the sampling error determination portion further includes a noise transfer function component configured to apply a noise transfer function to the sampling error to provide a transformed sampling error, and wherein the circuit further comprises a combiner component coupled to combine the transformed sampling error with the digitized output to provide the final output.

4. The circuit as recited in claim 1, further comprising a signal-shaping component to receive an input signal and provide the shaped signal, the signal-shaping component being characterized by a complex transfer function.

5. The circuit as recited in claim 3, wherein the noise transfer function is an inverse transformation of a complex transfer function, the complex transfer function being characterized by H(s), and the noise transfer function being characterized by $(1+H(z))^{-1}$.

6. The circuit as recited in claim 2, wherein the combiner component comprises a first combiner component and an input signal to the circuit comprises a difference signal.

7. The circuit as recited in claim 1, wherein the analyzer comprises a comparator.

8. The circuit as recited in claim 1, further comprising a signal-shaping component including at least one of a pulse width modulator, a sigma delta converter, a multi-stage noise shaping component, and a loop filter.

9. The circuit as recited in claim 1, wherein the time-to-digital converter includes:
a delay portion coupled to receive the analyzer output;
a triggering portion coupled to receive the clock signal; and a logic component configured to determine the sampling error based on one or more inputs from at least one of the delay portion and the triggering portion.

10. The circuit as recited in claim 1, wherein the time-to-digital converter includes:
a delay portion coupled to receive the analyzer output, the delay portion including a plurality of delay elements coupled in series;
a triggering portion coupled to receive the clock signal, the triggering portion including a plurality of readers coupled to receive a plurality of output states from successive portions of the delay portion; and
a logic component coupled to receive a plurality of readouts from the plurality of readers at a frequency corresponding to the clock signal, and to determine the sampling error based on the plurality of readouts.

11. An electronic device, comprising:
a processor; and
a communication component operatively coupled to the processor and configured to at least one of receive and transmit communication signals, the communication component including a modulator component having:
an analyzer coupled to receive a shaped signal and to provide an analyzer output having associated therewith one of a first value and a second value, the analyzer output having associated therewith the first value when the shaped signal is within a first range, and the analyzer output having associated therewith the second value when the shaped signal is within a second range;
a sampling component to receive the analyzer output and a clock signal, and to provide a digitized output based on the clock signal; and
a sampling error determination portion coupled to the sampling component and having a time-to-digital converter configured to determine a sampling error based on a time difference between the analyzer output and the clock signal.

12. The electronic device as recited in claim 11, wherein the communication component further comprises:
a noise transfer function component configured to apply a noise transfer function to the sampling error to provide a transformed sampling error; and
a combiner component coupled to combine the transformed sampling error from the digitized output to provide a final output.

13. The electronic device as recited in claim 11, further comprising a signal-shaping component to provide the shaped signal, the signal-shaping component characterized by a complex transfer function.

14. The electronic device as recited in claim 13, wherein the combiner component comprises a first combiner component, and wherein the communication component further comprises a second combiner component coupled to combine the digitized output with an initial input signal to provide the input signal to the signal-shaping component, the digitized output being fed back from the sampling component to the second combiner component.

15. The electronic device as recited in claim 11, wherein the time-to-digital converter includes:
a delay portion coupled to receive the analyzer output, the delay portion including a plurality of delay elements coupled in series;
a triggering portion coupled to receive the clock signal, the triggering portion including a plurality of readers coupled to receive a plurality of state outputs from successive portions of the delay portion; and
a logic component coupled to receive a plurality of readouts from the plurality of readers at a frequency corresponding to the clock signal, and to determine the sampling error based on the plurality of readouts.

16. A method, comprising:
providing an output signal having associated therewith one of a first value and a second value, the output signal having the first value when a shaped signal is within a first range, and the output signal having the second value when the shaped signal is within a second range; generating a digitized signal based on the output signal and a clock signal; and
determining a sampling error based on a time-to-digital conversion of a time difference between the output signal and the clock signal.

17. The method as recited in claim 16, wherein determining a sampling error further includes applying a noise transfer function to the sampling error to provide a transformed sampling error, and wherein the method further comprises combining the transformed sampling error with the digitized signal to provide a corrected output.

18. The method as recited in claim 16, further comprising:
receiving an initial signal; and
combining the digitized signal with the initial signal, the digitized signal being fed back from the generating of the digitized signal.

19. The method as recited in claim 16, wherein determining a sampling error based on a time-to-digital conversion includes:
receiving the analyzer output into a delay portion having a plurality of delay elements coupled in series;
receiving the clock signal into a triggering portion having a plurality of readers coupled to receive a plurality of state outputs from successive portions of the delay portion; and
determining the sampling error based on a plurality of readouts from the plurality of readers at a frequency corresponding to the clock signal.

* * * * *